United States Patent [19]

Cho

[11] Patent Number: 5,848,024
[45] Date of Patent: Dec. 8, 1998

[54] CLOCK CONTROLLED COLUMN DECODER

[75] Inventor: Il-Jae Cho, Suwon, Rep. of Korea

[73] Assignee: Samsung Electronics, Co., Ltd., Suwon, Rep. of Korea

[21] Appl. No.: 780,632

[22] Filed: Jan. 8, 1997

[30] Foreign Application Priority Data

Jan. 8, 1996 [KR] Rep. of Korea ............... 1996 217

[51] Int. Cl.$^6$ ........................ G11C 8/00
[52] U.S. Cl. ............... 365/230.06; 365/233; 365/194; 365/203
[58] Field of Search ............... 365/230.06, 233, 365/194, 203, 230.08

[56] References Cited

U.S. PATENT DOCUMENTS

| | | | |
|---|---|---|---|
| 5,521,878 | 5/1996 | Ohtani et al. | 365/230.08 X |
| 5,544,124 | 8/1996 | Zagar et al. | 365/233 X |
| 5,546,346 | 8/1996 | Agata et al. | 365/233 X |

OTHER PUBLICATIONS

"A 200 MHz 16Mbit Synchronous DRAM with Block Access Mode", 1994 Symposium on VLSI Circuits Digest of Technical Papers, by Atsushi Fujiwara, et al., 1994 (pp. 79&80).

*Primary Examiner*—Huan Hoang
*Attorney, Agent, or Firm*—Marger, Johnson, McCollom, & Stolowitz P.C.

[57] ABSTRACT

A column decoder of a semiconductor memory device operates in synchronism to an external system clock to decode externally-supplied column addresses. The column decoder has a column select line enable unit which decodes the externally-supplied column addresses and generates a plurality of predecoded column addresses. The column decoder uses a predecoder to predecode the externally-supplied column addresses and generate the predecoded column addresses. The column select line enable unit also uses the predecoder to sample one of the predecoded column addresses in synchronism to the external system clock using an automatic control clock, thereby enabling a column select line. A precharge pulse generator latches one of the predecoded column addresses in response to a first level of the external system clock, triggers to the latched signal in response to a second level of the external system clock, and thereby generates a precharge pulse which is delayed by a specified amount. A column select line enable circuit enables the column select line in response to an enable clock by combining the sampled predecoded column address with the other predecoded column addresses, and which disables the column select line in response to the precharge pulse. The column decoder of the present invention allows for the control of a generation time of the precharge pulse and for the adjusting of a disable interval of the column select line to enhance operation of the column decoder over a wide range of operating frequencies of the semiconductor memory device.

12 Claims, 7 Drawing Sheets

CLOCK CONTROLLED COLUMN DECODER

BACKGROUND OF THE INVENTION

1. Field of the Invention

The present invention relates to a column decoder of a semiconductor memory device and, more specifically, to a clock-controlled column decoder capable of being efficiently adapted to a synchronous semiconductor memory device.

2. Description of the Related Art

At present, operation speed of a semiconductor memory device increases in proportion to the operation speed of a microprocessor system. By way of an example, a high speed memory device operates at a frequency of hundreds of megahertz synchronous to an external system clock. Such a high speed memory device is referred to herein as a synchronous semiconductor memory device. The synchronous semiconductor memory device is constructed to perform operations of all commands related to read/write operations in synchronism to the external system clock.

A synchronous semiconductor memory device operated in synchronism to the external system clock is externally supplied with row addresses and column addresses to write or read the data in a selected memory cell, such that a single column line among a plurality of column lines can be selected by combination of the supplied column addresses.

According to the prior art, a general dynamic random access memory (hereinafter, "DRAM") predecodes externally applied column addresses through a predecoder and decodes the predecoded column addresses through a column decoder, the output of the column decoder being finally selected as one of a plurality of the column lines.

A synchronous DRAM, on the other hand, inputs the column addresses in synchronism to the external system clock and selects one column line using the column address synchronized to the external system clock. This column selection method of the prior art is disclosed in a paper entitled "A 200 MHz 16 Mbit Synchronous DRAM with Block Access Mode", on pages 79 to 80 of a publication entitled "1994 Symposium on VLSI circuits Digest of Technical Papers".

Figure 1:
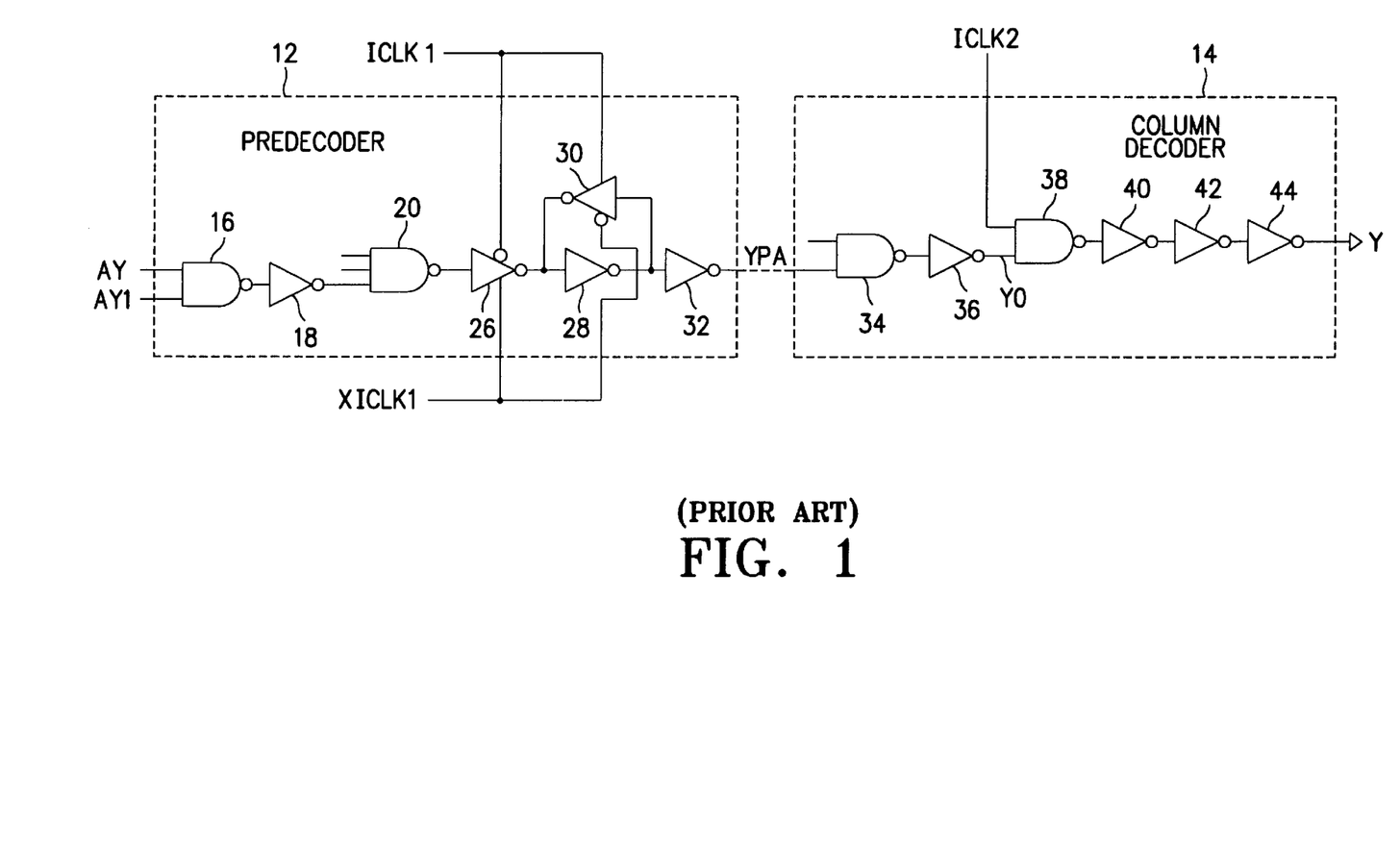
FIG. 1 is a schematic diagram of a clock-controlled column decoder according to the prior art.

Referring to FIG. 1, a prior art clock-enabled column decoder, referred to as a "pulsed column decoder" in the above paper, is largely comprised of a predecoder 12 for predecoding an externally applied column address AYi (herein, i=natural numbers such as 0,1,2, . . . , n) and for generating a predecoded column address as a column address YPA, predecoded by internal clocks ICLK1 and XICLK1 synchronized to an external system clock; and a column decoder 14 for gating the predecoded address YPA with a delayed internal clock ICLK2 and thereby outputting a column line select signal Y.

According to the prior art, after predecoding the corresponding column addresses AY0 and AY1, the predecoder 12, which consists of NAND gates 16 and 20, inverters 18, 28, and 32, and tri-states inverters 26 and 30, outputs the predecoded signal YPA in synchronism with a falling edge, i.e. a low going edge, of the internal clock ICLK1 synchronized to the external system clock Ext.CLK. The column decoder 14, which includes NAND gates 34 and 38 and a plurality of inverters 36, 40, 42 and 44, generates a precolumn select line signal YO by the combination of the predecoded signal YPA. The column decoder 14 then converts the precolumn select line signal YO, to output the column select line signal Y, by combining it YO with the delayed internal clock ICLK2. (See the above mentioned paper entitled "A 200MHz 16 Mbit Synchronous DRAM with Block Access Mode", on pages 79 to 80 of "1994 Symposium on VLSI circuits Digest of Technical Papers," for a detailed explanation of the prior art.)

Figure 2:
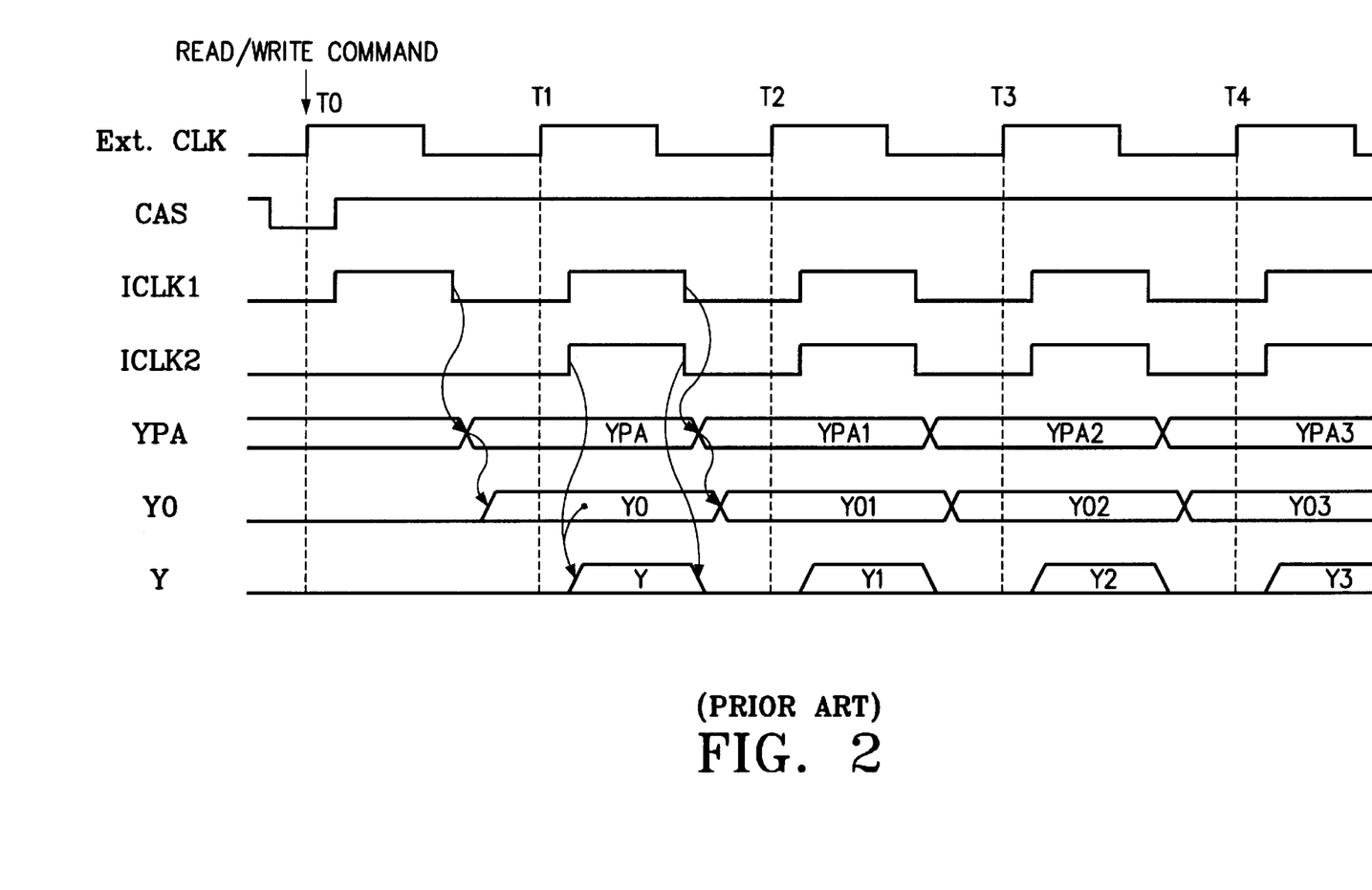
FIG. 2 is a timing diagram of the clock-controlled column decoder of the prior art, as shown in FIG. 1.

An operation of the prior art clock-enabled column decoder, as shown in FIG. 1, will now be briefly explained with reference to the timing diagram of FIG. 2. Particularly, when the column addresses AY0 and AY1 are enabled to the logic "high" level, the output of the NAND gate 20 is transmitted to the logic "low" level. The output of the NAND gate 20 is then latched to a latch circuit composed of the inverter 28 and the tri-states inverters 30 in synchronism with the falling edge of the internal clock ICLK1, which is synchronized with the external system clock Ext.CLK. The latched output of the NAND gate 20 is inverted to the logic "high" level by the inverter 32, which is connected to an output node of the predecoder 12. Accordingly, in this instance, when the internal clock ICLK1 is transmitted to the logic "low" level, the predecoded signal YPA, outputted from the predecoder 12, is enabled to and maintained at the logic "high" level.

The operation of a column decoder 14, connected to the output node of the predecoder 12 through an input node of NAND gate 34, is as follows. When the predecoded signal YPA is enabled to the logic "high" level, the pre-column select line signal YO, outputted from the NAND gate 34 through inverter 36, is likewise enabled to the logic "high" level. The delayed internal clock ICLK2 is generated in synchronism to the internal clock ICLK1 beginning one clock pulse from after a column address strobe command CAS is applied. The NAND gate 38 combines the delayed internal clock ICLK2 and the pre-column select line signal YO and enables the column select line signal Y through inverters 40,42, and 44 to the logic "high" level. Therefore, the column select line signal Y is enabled in response to a rising edge, i.e. a high going edge, of the delayed internal clock ICLK2 and is disabled in response to a falling edge thereof.

Consequently, the prior art column decoder enables the column select line signal Y in synchronism to the delayed internal clock ICLK2, which is generated one clock pulse after the CAS command is applied, and further determines an enable interval by a logic "high" duration of the delayed internal clock ICLK2. It should be noted that the enable interval of the column select line signal Y absolutely depends on the duration of the logic "high" level of the delayed internal clock ICLK2.

Unfortunately, the prior art column decoder constructed as above has several problems. First, because the column address is set by the internal clock ICLK1 and the column select line signal Y is enabled by the combination of the predecoded signal YPA outputted from the predecoder 12 and the delayed internal clock ICLK2, the generation of the column select line signal Y relies heavily on the delayed internal clock ICLK2. Therefore, even when the speed of the pre-column select line signal YO becomes high, the column select line signal Y finally outputted is only enabled in synchronism to a next rising edge of the delayed internal clock ICLK2, thereby resulting in speed loss. Furthermore, when the frequency of the external system clock Ext.CLK is changed, the generation time of the delayed internal clock ICLK2 is also changed. Thus, in the event that the delayed internal clock ICLK2 is transmitted to the logic "high" level before the pre-column select line signal YO is set, an invalid column select line signal Y is generated which may cause a malfunction of the semiconductor memory device.

Second, when the delayed internal clock ICLK2 corresponds to an automatic pulse produced by an automatic pulse generator, a pulse width of the column select line signal Y is set to the width of the automatic pulse. However, the pulse width of the column select line signal Y should be established in conformity with a maximum operation frequency of the memory device rather than in connection with the automatic pulse. Otherwise, especially at a low frequency, the pulse width of the column select line signal Y cannot enhance the operation margin of the synchronous semiconductor memory device. Specifically, when the enable interval of the column select line signal Y, according to the prior art, is increased by the lowering of the operation frequency, the read/write operation margin is likewise increased, and the low voltage operation margin is significantly deteriorated when the column select line signal Y pulse width corresponds to the width of the automatic pulse.

SUMMARY OF THE INVENTION

It is, therefore, an object of the present invention to provide a clock-controlled column decoder of a synchronous semiconductor memory device for selecting a column line of a memory cell at a wide range of operating frequencies, between a low frequency and a high frequency, i.e. such as within the hundreds of megahertz range.

It is another object of the present invention to provide a clock-controlled column decoder for decoding an externally applied column address by sampling the decoded address using an internal clock synchronized to the external system clock, thereby enabling a column select line.

It is yet another object of the present invention to provide a precharge pulse generator for automatically disabling the enabled column select line, by sampling the address decoded by the internal clock synchronized to the external system clock.

It is still another object of the present invention to provide a clock-controlled column decoder for decoding an externally applied column address that enables the column select line in response to a sampling of an internal clock, which decodes the column address by synchronizing the internal clock to the external system clock and by delaying the column select line by a period longer than the delay of the internal clock, and disabling the delayed column select line by a precharge pulse applied after the above delay.

In order to achieve the above objects, a column decoder according to the present invention operates in synchronism to an external system clock. The column decoder comprises a column select line enable unit for decoding a plurality of externally-supplied column addresses and for generating a plurality of predecoded column addresses. The column select line enable unit also samples the predecoded column addresses in synchronism to the external system clock using an automatic control clock, and thereby enables a column select line. The column decoder also comprises a column select line disable unit which latches one of the predecoded column addresses in response to a first level of the clock, thereby producing a latched signal. The column select line disable unit disables the enabled column select line in response to the latched signal. The clock-controlled column decoder further comprises a predecoder which predecodes the externally-supplied column addresses, generating the predecoded column addresses. The predecoder also samples one of the predecoded column addresses in synchronism to the external system clock using an automatic control clock. The clock-controlled column decoder also has a precharge pulse generator which latches one of the predecoded column addresses in response to a first level of the clock, triggers to the latched signal in response to a second level of the clock, and thereby generates a precharge pulse which is delayed. The column decoder finally comprises a column select line enable circuit which enables the column select line in response to an enable clock by combining the sampled predecoded column address with the other predecoded column addresses, and which disables the column select line in response to the precharge pulse.

BRIEF DESCRIPTION OF THE DRAWINGS

A more complete appreciation of this invention, and the attendant advantages thereof, will be more readily apparent through the detailed description of the preferred embodiments made with reference to the following drawings, in which like reference symbols indicate the same or similar components, wherein.

DETAILED DESCRIPTION OF THE PREFERRED EMBODIMENTS

Figure 6:
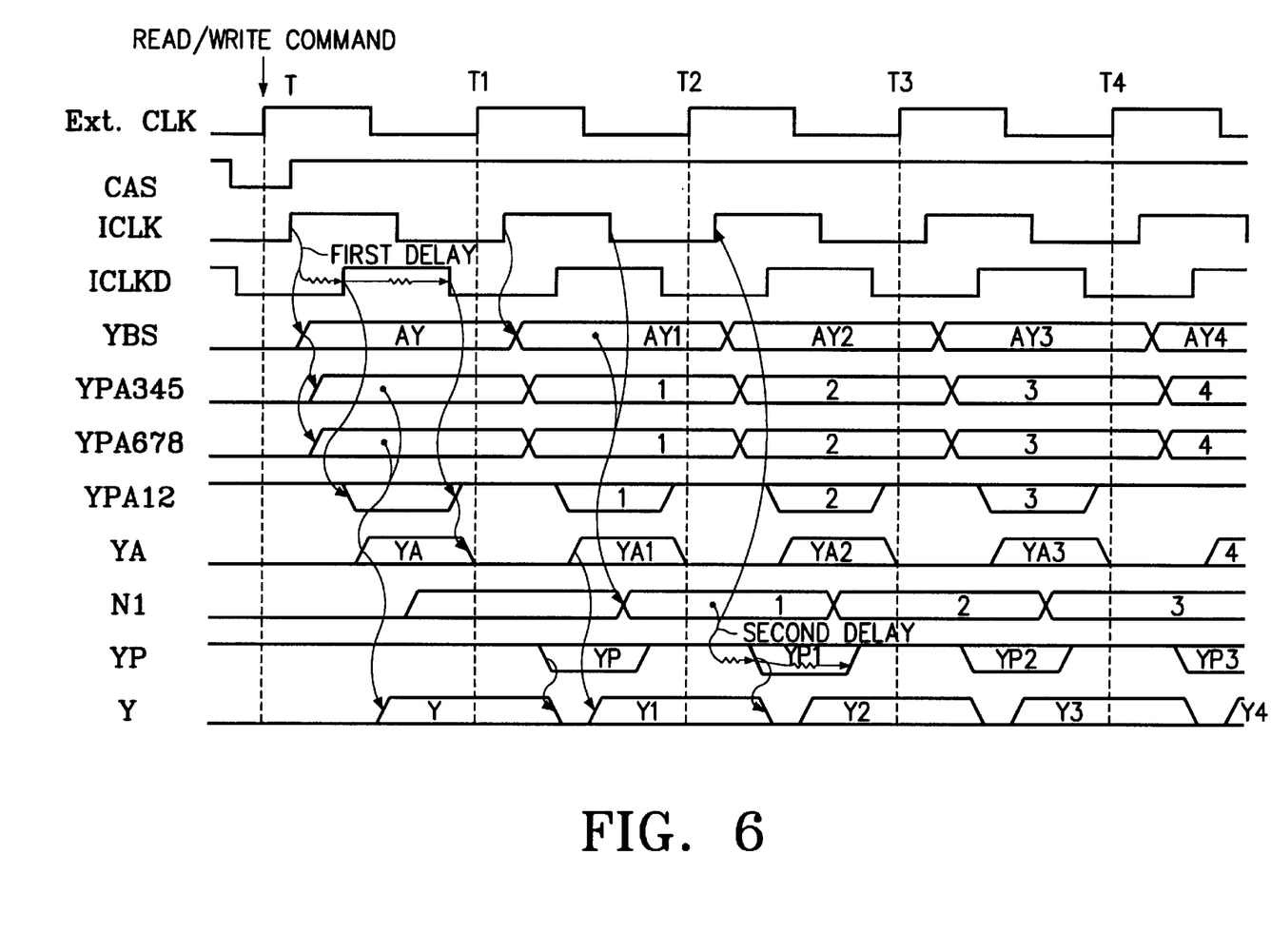
FIG. 6 is a timing diagram showing the operation of the clock-controlled column decoder and its respective components, as shown in FIGS. 3, 4, and 5.

Referring to FIG. 6, in the operation of a clock-controlled column decoder according to a first preferred embodiment of the present invention, when an external system clock Ext. CLK is applied to the clock-controlled column decoder, an internal clock ICLK located within the synchronous semiconductor memory device as in a general synchronous semiconductor memory device, is synchronized with the external system clock Ext.CLK. When the column address strobe command CAS is applied, a band select signal YBS, for selecting a memory band, and a column address AYi are synchronized with the rising edge of the internal clock ICLK, and thereby applied to the synchronous semiconductor memory device.

Figure 3:
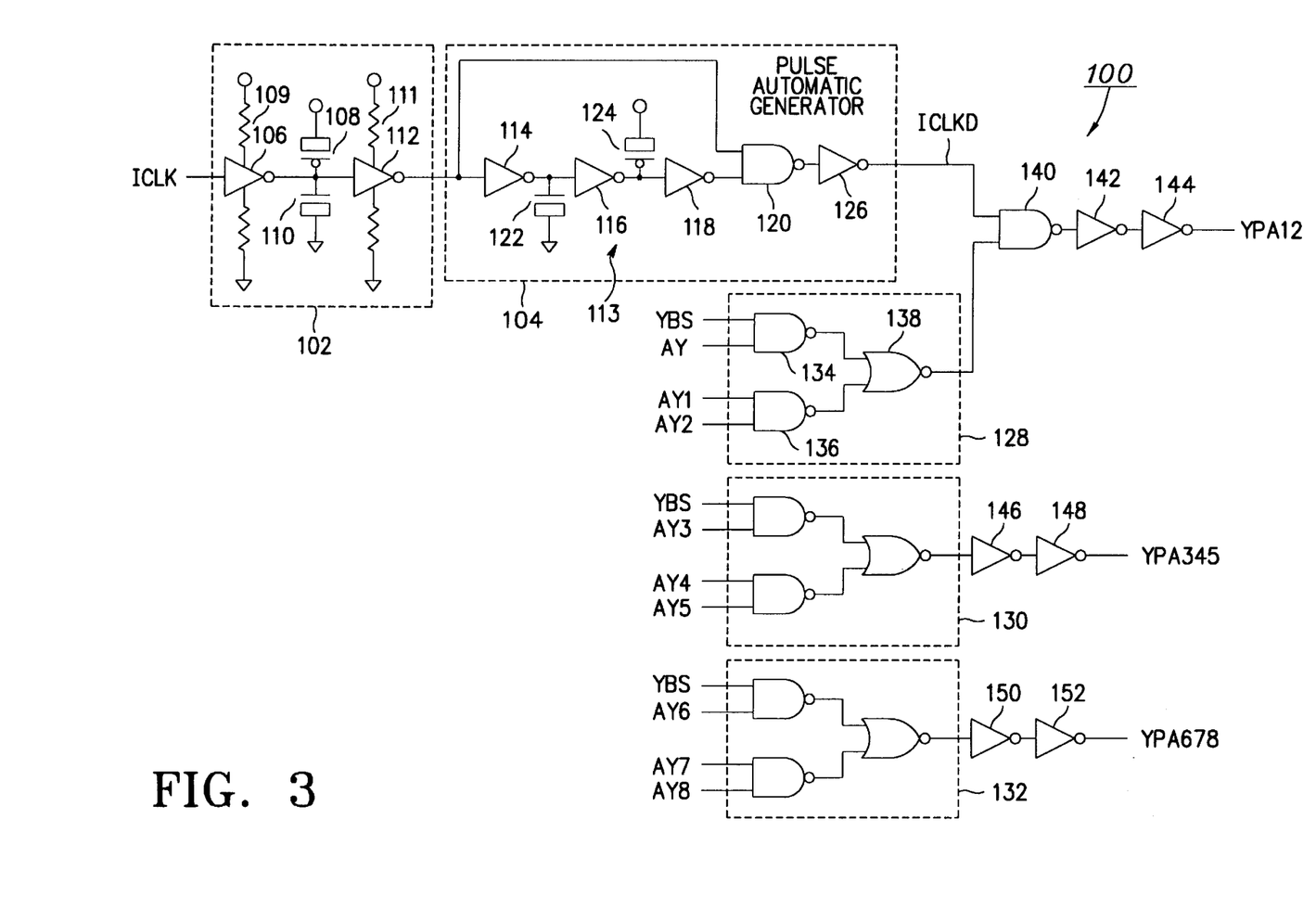
FIG. 3 is a schematic diagram of an enable pulse generator of a clock-controlled column decoder according to a first preferred embodiment of the present invention.

Referring to FIG. 3, a first delay unit 102 has its input node connected to the internal clock ICLK and is comprised of two inverters 106 and 112 connected in series with each other, a PMOS transistor 108 and an NMOS transistor 110. Each of the transistors 108 and 110 is connected to a contact node between the inverters 106 and 112, and further connected between a power supply voltage Vcc and a ground voltage Vss. The first delay unit 102 thereby delays the applied signal from the internal clock ICLK according to the resistance of resistors 109 and 111 connected to between the power supply voltage Vcc and the inverters 106 and 112, respectively, and an RC time constant value of the PMOS transistor 108 and the NMOS transistor 110. The delay amount is therefore capable of being varied in conformity with an adjustment of the RC time constant of the MOS transistors 108 and 110. In this manner, the first delay unit 102 delays the internal clock ICLK and supplies a delayed clock output to an input node of an automatic pulse generator 104.

The automatic pulse generator 104 comprises an odd inverter chain 113 (which can be comprised of any odd number of inverters depending on the desired delay, three are shown here for simplicity) consisting of inverters 114, 116 and 118, which are connected in series to the output node of the first delay unit 102. The automatic pulse generator 104 further comprises an NAND gate 120 which outputs a logic "low" level signal only when both the output of the inverter chain and the output of the first delay unit 102 are enabled to the logic "high" level. An inverter 126 is also connected to the output node of the NAND gate 120. Accordingly, as the output from the first delay unit 102, delayed from internal clock ICLK, is a first edge, i.e. a rising edge, the automatic pulse generator 104 generates an automatic control clock ICLKD having a width corresponding to the delay time of the inverter chain 113. The generated pulse is then supplied to an input node of a NAND gate 140. Therefore, a first delay, i.e. the delay interval between the internal clock ICLK and the automatic control clock ICLKD, is determined by the RC time constant of the first delay unit 102.

A decoder 128, of a plurality of decoders, decodes the band select signal YBS and valid column addresses AY0, AY1 and AY2, and provides the resulting output to the other input node of the NAND gate 140. Another decoder 130 decodes the band select signal YBS and the valid column addresses AY3, AY4, AY5, and a third decoder 132 decodes the band select signal YBS and the valid column addresses AY6, AY7 and AY8. Decoders 130 and 132 output the predecoded column addresses YPA345 and YPA678, respectively, which are then provided to two input nodes of an NAND gate 176 (see FIG. 5) through the inverters 146 and 148, and the inverters 150 and 152, respectively.

As a result, when the automatic control clock ICLKD is transmitted to a rising edge (see FIG. 6), the NAND gate 140 gates the automatic control clock ICLKD with the output of decoder 128 to produce a predecoded column address YPA0 12 in the logic "low" level (see FIG. 6). In other words, when the automatic control clock ICLKD goes to the rising edge, the predecoded column address YPA012 is enabled as the logic "low" level, and when the automatic control clock ICLKD goes to a falling edge, the predecoded column address YPA012 is disabled as the logic "high" level. After decoding by the automatic control clock ICLKD, the column address YPA012 is provided to an input node of a NOR gate 178 (see FIG. 5).

Figure 5:
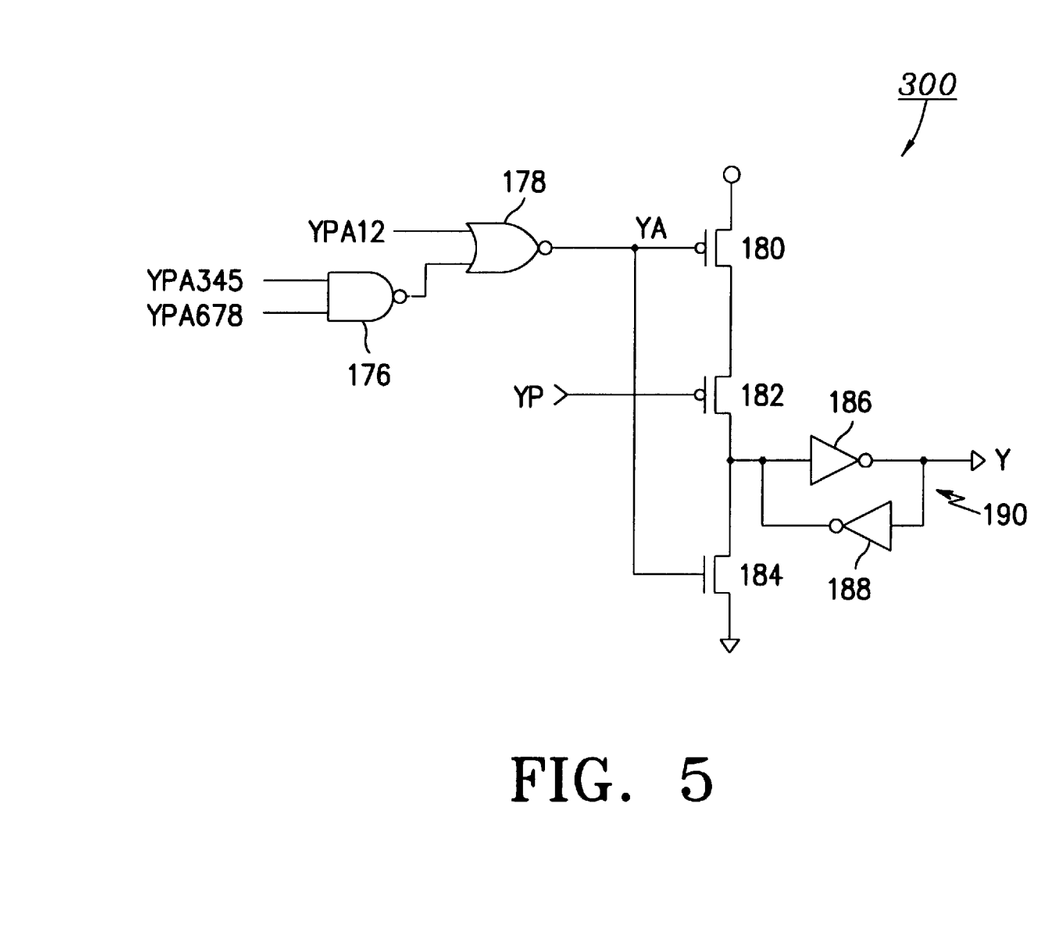
FIG. 5 is a schematic diagram of a column select line enable circuit of a clock-controlled column decoder according to the first preferred embodiment of the present invention, interrelated to FIGS. 3 and 4.

Referring to FIG. 5, the NAND gate 176 gates the predecoded column addresses YPA345 and YPA678 outputted as the logic "high" level (see FIG. 6) from the decoders 130 and 132 (see FIG. 3) and supplies the outputted signal of the logic "low" level to the other input node of the NOR gate 178. Thus, the NOR gate 178 combines the column address YPA012 with the output of the NAND gate 176 and outputs a column line enable clock YA (see FIG. 6) at the logic "high" level.

The column line enable clock YA outputted from the NOR gate 178 is supplied to the gate of a first PMOS transistor 180 and the gate of an NMOS transistor 184, the transistors 180 and 184 being connected in series with a second PMOS transistor 182 between the power supply voltage Vcc and the ground voltage Vss. A latch circuit 190, composed of inverters 186 and 188, is connected to a contact node between the second PMOS transistor 182 and the NMOS transistor 184, and outputs to a column select line Y.

Consequently, the column line enable clock YA is generated for the same duration as the logic "low" interval of the sampled column address YPA012. Furthermore, when the column line enable clock YA is transmitted to the logic "high" level (see FIG. 6), the first PMOS transistor 180 is turned off and the NMOS transistor 184 is turned on and the output node of the latch circuit 190 is thereby latched to the logic "high" level, and the column select line Y is correspondingly enabled to the logic "high" level. However, the column select line Y would be transmitted from the logic "high" level to the logic "low" level, even though the first PMOS transistor 180 is turned on and the NMOS transistor 184 is turned off, when the second PMOS transistor 182 is turned off, i.e. during the interval when the level of the precharge pulse YP is at the logic "high" level, were it not for the latch circuit 190. For this reason, the latch circuit 190 is provided to maintain the logic "high" level of the column select line Y(see FIG. 6) for a desired length of time.

Referring to FIG. 6, therefore, the first delay created by the first delay unit 102 (see FIG. 3) controls the time of adjusting the level of the signal YPA012, outputted from the inverter 144 (see FIG. 3), to the logic "low" level, preferably, such that it is slower than the time of adjusting the output of the NAND gate 176 (see FIG. 4) to the logic "low" level, by enabling the predecoded column addresses YPA345 and YPA678 to the logic "high" level. The adjustment of the first delay is performed regardless of the address information of the predecoded column addresses YPA345 and YPA678 and regardless of the skew of the predecoder 128.

Figure 4:
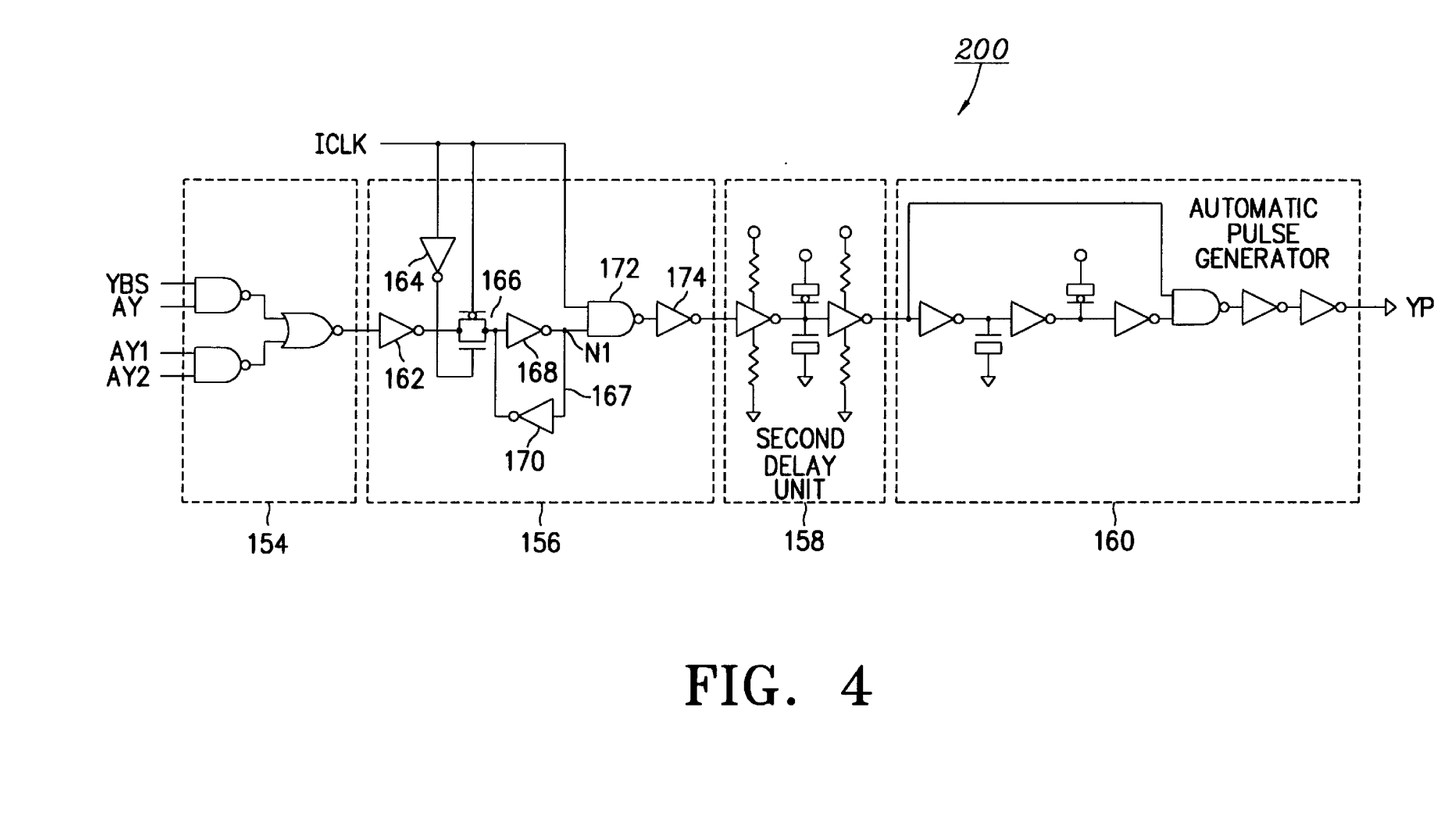
FIG. 4 is a schematic diagram of a precharge pulse generator of a clock-controlled column decoder according to the first preferred embodiment of the present invention, interrelated to FIG. 3.

Referring to FIG. 4, the column select line Y (see FIGS. 5 and 6) enabled by the above described operation is disabled by the precharge pulse YP outputted from a precharge pulse generator 200. The precharge pulse generator operates as follows. A decoder 154 decodes the band select signal YBS and the column addresses AY0, AY1, and AY2, through two NAND gates and a NOR gate, as illustrated, such that when all of signals received by the decoder 154 are validly applied at the logic "high" level, a signal in the logic "high" level is supplied from the decoder 154 to a disable signal generator 156.

After receiving the signal from the decoder 154, an inverter 162 of the disable signal generator 156 inverts the signal and supplies the inverted signal to a transit gate 166. The transit gate 166 stores the inverted signal at the falling edge of the internal clock ICLK. In other words, the decoded combination of column address AYi and the band select signal YBS is stored at a latch circuit 167, composed of a pair of inverters 168 and 170, when the internal clock ICLK transits to the falling edge and thereby opens the transit gate 166. An output node N1 of the latch circuit 167 is transmitted to the logic "high" level when the signal from the decoder 154 is in the logic "high" level and the internal clock transits to the falling edge (see FIG. 6). The information stored at the output node N1 of the latch circuit is gated by an NAND gate 172 to the internal clock ICLK, such that it is enabled at the rising edge of the next internal clock ICLK. The output of the NAND gate 172 is supplied to a second delay unit 158 through an inverter 174.

The second delay unit 158 delays the signal from the disable signal generator 156 and outputs the delayed signal to an automatic pulse generator 160. The construction of the automatic pulse generator 160 is similar to that of the automatic pulse generator 104 (see FIG. 3) except that the automatic pulse generator 160 has an added inverter at its output node, such that an output thereof goes to the logic "low" level when the delayed input signal is at the logic "high" level.

Referring to FIG. 6, when the column select line Y is transmitted to the logic "high" level at the rising edge of the internal clock ICLK, the precharge pulse generator 200 (see FIG. 4) latches the column address AYi and the band select information YBS and automatically generates the precharge pulse YP of the logic "low" level at the rising edge of the next internal clock ICLK.

Referring to FIGS. 5 and 6, the logic "low" level precharge pulse YP enables the second PMOS transistor 182 in the column select line enable circuit 300 to be turned on. Since the first PMOS transistor 180 is also turned on, the output of the latch circuit constructed with two inverters 186 and 188 is precharged to the logic "low" level, thereby disabling the column select line Y as the logic "low" level.

In operation, an enable clock YA0 is generated by a column address AY0, which is selected at an interval of time T0 in response to the internal clock ICLK, when the read/write command is applied. The column select line Y0 is thereby enabled. The enable clock YA0 is disabled by the rising edge of a sampled column address YPA012, corresponding to the falling edge of the automatic control clock ICLKD. The precharge pulse YP0 is generated at an interval of time T1 when a column address AY1 is unlike the column address AY0 (that is, when a different column line is being selected). However, when the same column line is selected (i.e., the column address AY0 is the same as the column address AY1 at the interval of time T1), the column select line Y0 previously enabled by the enable clock YA0 generated at the interval of time T1 is disabled by turning on the second PMOS transistor 182. However, when the enable clock YA1 is enabled, the first PMOS transistor 180 is turned off and the NMOS transistor 184 is turned on, and thereby the column select line Y is enabled. Even when the second PMOS transistor 182 is turned off due to the precharge pulse YP becoming logically "high," the output of the column select line Y is maintained by virtue of the latch 190. Accordingly, the overall operation of the clock-controlled column decoder is determined regardless of any overlap between the enable clock YA and the precharge pulse YP.

Finally, it should be noted that the time during which the column select line Y of the clock-controlled column decoder is enabled can be varied by adjusting the RC time constant of the first delay unit 102 (see FIG. 3). Furthermore, the time during which the column select line Y is disabled can be varied by adjusting the RC time constant of the second delay unit 158 (see FIG. 4), so that the enable interval of the column select line Y can also be easily adjusted. Therefore, as the external system clock Ext.CLK goes to a low frequency, the read/write operation characteristic can be enhanced, by increasing the enable interval of the column select line Y. This is because the enable clock YA and the precharge pulse YP are generated by the same internal clock ICLK, even if the frequency of the external system clock Ext.CLK supplied to the synchronous semiconductor memory device becomes low. It is also easy for the clock-controlled. column decoder according to the present invention to correspond to a high frequency external system clock Ext.CLK by decoding the column by predecoding the shorter path using the already known delay setting in order to remove the address skew.

Figure 7:
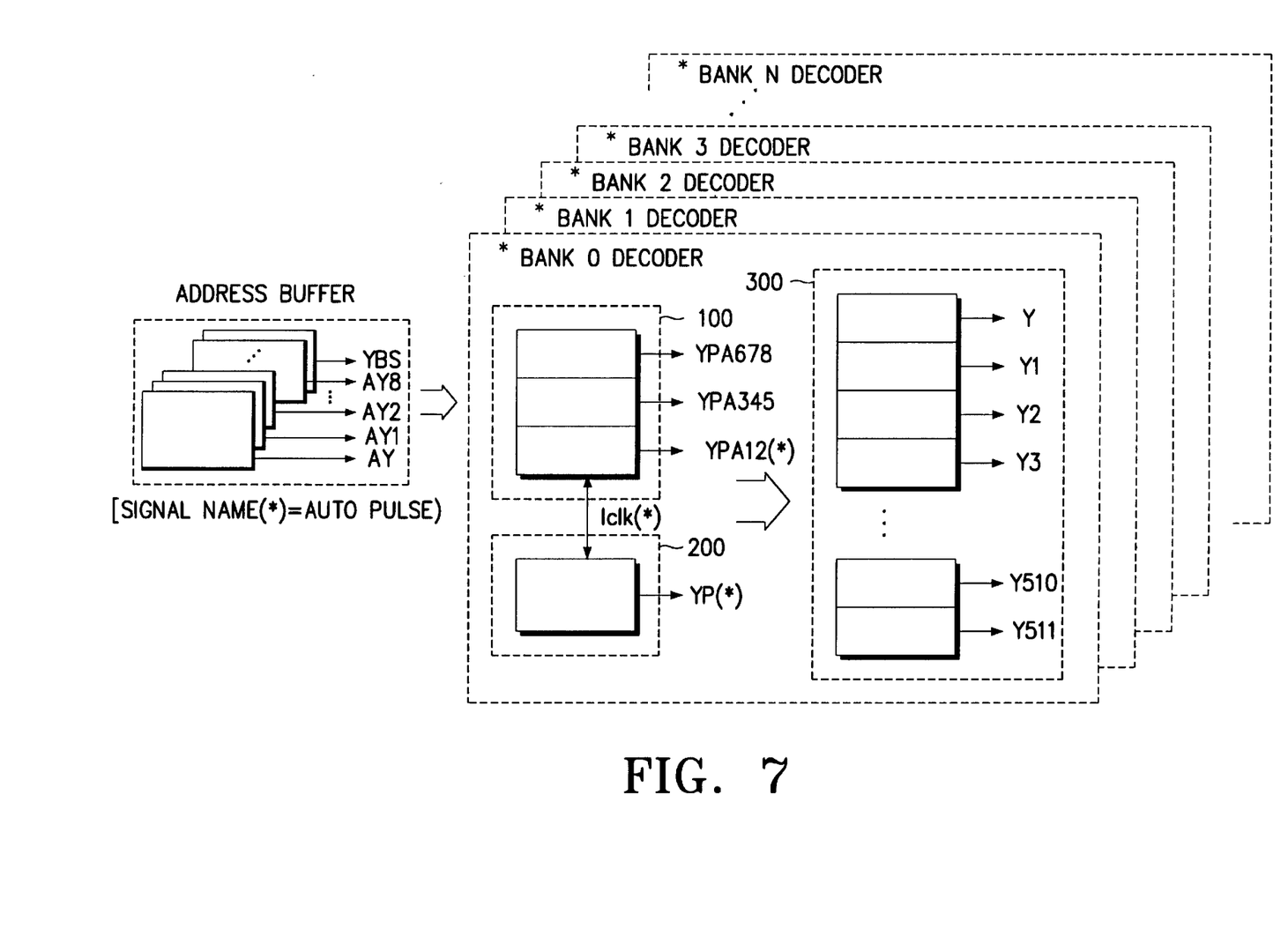
FIG. 7 is a schematic diagram of a clock-controlled column decoder according to a second preferred embodiment of the present invention, adapted for use in a multi-bands semiconductor device.

Referring to FIG. 7, a clock-controlled column decoder according to a second preferred embodiment of the present invention is adapted to a multi-bands semiconductor device. A plurality of band decoders input the column address AYi and the band select signal YBS, outputted from the column address buffer, respectively. Each of the band decoders included with the enable pulse generator 100, the precharge pulse generator 200, and the column select line enable circuit 300, synchronously decodes the external column address and respectively selects the column select lines Y0, Y1, Y2, . . . , Yn in the same manner as described in the first preferred embodiment.

As apparent from the foregoing description, the present invention has an advantage over the prior art because the column line is selected by sampling a predecoded column address using the output of an internal clock synchronized to the external system clock. The column select line is thereby enabled by a sampled signal, and the enabled column select line is subsequently disabled by a precharge pulse synchronized to the next clock pulse of the internal clock, thereby stably operating within a wide range of operating frequencies.

Having described and illustrated the principles of the present invention in a first and second preferred embodiment thereof, it should be apparent that the invention can be modified in arrangement and detail without departing from such principles.

I claim all modifications and variations coming within the spirit and scope of the following claims:

1. A column decoder which operates in synchronism to an external clock, implemented in a synchronous semiconductor memory device, comprising:

a column select line enable unit for generating and sampling a plurality of predecoded column addresses decoded from a plurality of externally supplied column addresses, and for enabling a column select line;

an automatic control clock for determining a sampling time of the predecoded column addresses; and a column select line disable unit for latching one of said predecoded column addresses in response to a first level of said external clock, thereby producing a latched signal, and for disabling the column select line in response to the latched signal.

2. A column decoder of a synchronous semiconductor memory device which operates in synchronism to a clock having a first level and a second level, the column decoder comprising;

a predecoder for generating a plurality of predecoded column addresses in response to a plurality of externally supplied column addresses, and for sampling one of said predecoded column addresses;

an automatic control clock for controlling the sampling of the predecoded column address by the predecoder;

a precharge pulse generator for generating a precharge pulse in response to said second level of said clock; and an enable clock produced by combining the predecoded column address sampled by the predecoder with other predecoded column addresses; and a column select line enable circuit for enabling a column select line in response to the enable clock and for disabling said column select line in response to said precharge pulse.

3. The column decoder according to claim 2, wherein said predecoder further comprises:

a first delay unit for delaying said clock and for generating a delayed clock;

a first automatic pulse generator for generating the automatic control clock having a predetermined duration by triggering to a first edge of said delayed clock;

a plurality of column address decoders for decoding a band select signal and a valid column address and for generating said plurality of predecoded column addresses; and a sampling unit for sampling one of the predecoded column addresses in response to the automatic control clock.

4. The column decoder according to claim 3, wherein said sampling unit is a NAND gate.

5. The column decoder according to claim 3, wherein said first delay unit includes a means for adjusting a sampling time.

6. The column decoder according to claim 3, wherein said first automatic pulse generator includes a means for adjusting an enable interval of said column select line.

7. The column decoder according to claim 2, wherein said precharge pulse generator comprises:

a latch circuit for latching one of said predecoded column addresses in response to the first level of said clock to produce a latched signal;

a second delay unit for delaying the latched signal in response to the second level of said clock and for outputting a delayed output; and a second automatic pulse generator for automatically generating the precharge pulse having a specified duration by triggering to the delayed output of said second delay unit.

8. The column decoder according to claim 7, wherein said second delay unit includes a means for adjusting a generation time of said precharge pulse.

9. The column decoder according to claim 7, wherein said second automatic pulse generator includes a means for adjusting a disable interval of said column select line.

10. The column decoder according to claim 2, wherein said column select line enable circuit comprises:

a first MOS transistor of a first channel type having a source, a drain, and a gate, the source being connected to a power supply voltage and the gate being connected to said enable clock;

a second MOS transistor of the first channel type having a source, a drain, and a gate, the source being connected to the drain of said first MOS transistor and the gate being connected to the precharge pulse generator to receive the precharge pulse;

a third MOS transistor of a second channel type having a source, a drain, and a gate, the source being connected to the drain of the second MOS transistor, the drain being connected to a ground voltage, and the gate being connected to the enable clock; and a latch circuit having an input being connected to a contact node located between the drain of said second MOS transistor and the source of said third MOS transistor, the latch unit outputting said column select line through an output thereof.

11. A method for decoding a column address applied to a semiconductor memory device in synchronism with a clock, comprising the steps of:

predecoding a plurality of externally supplied column addresses;

generating a plurality of predecoded column addresses;

sampling the predecoded column addresses in synchronism to said clock using an automatic control clock;

enabling a column select line;

latching one of said predecoded column addresses in response to a first level of said clock, thereby producing a latched signal; and disabling the column select line in response to the latched signal.

12. The method according to claim 11, further comprising the step of triggering to the latched signal in response to a second level of said clock.

* * * * *

UNITED STATES PATENT AND TRADEMARK OFFICE
CERTIFICATE OF CORRECTION

PATENT NO.    : 5,848,024
DATED         : December 8, 1998
INVENTOR(S)   : Cho

It is certified that error appears in the above-identified patent and that said Letters Patent is hereby corrected as shown below:

Column 2,
Lines 11, 14 and 64, "transmitted" should read -- transitted --.

Column 5,
Line 44, "transmitted" should read -- transitted --.

Column 6,
Lines 16 and 57, "transmitted" should read -- transitted --.

Column 7,
Line 9, "transmitted" should read -- transitted --.
Line 63, "controlled. column" should read -- controlled column --.

Signed and Sealed this

Seventeenth Day of September, 2002

Attest:

JAMES E. ROGAN
Attesting Officer      Director of the United States Patent and Trademark Office